(12) United States Patent
Farkas et al.

(10) Patent No.: US 10,368,437 B2
(45) Date of Patent: Jul. 30, 2019

(54) CABLE ASSEMBLY FOR AN INFORMATION HANDLING SYSTEM

(71) Applicant: DELL PRODUCTS, L.P., Round Rock, TX (US)

(72) Inventors: Sandor Farkas, Round Rock, TX (US); Bhyrav M. Mutnury, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/480,611

(22) Filed: Apr. 6, 2017

(65) Prior Publication Data

US 2018/0294076 A1 Oct. 11, 2018

(51) Int. Cl.
| H05K 1/11 | (2006.01) |
| H01R 12/62 | (2011.01) |
| H01R 43/02 | (2006.01) |
| H05K 1/02 | (2006.01) |
| H05K 3/34 | (2006.01) |

(52) U.S. Cl.
CPC ............ *H05K 1/112* (2013.01); *H01R 12/62* (2013.01); *H01R 43/0256* (2013.01); *H05K 1/0219* (2013.01); *H05K 3/3405* (2013.01); *H05K 1/0245* (2013.01); *H05K 1/0298* (2013.01); *H05K 2201/09145* (2013.01); *H05K 2201/10356* (2013.01)

(58) Field of Classification Search
CPC .... H01B 11/1895; H01B 7/02; H01B 11/002; H05K 1/112; H05K 2201/07; H05K 2201/10356
See application file for complete search history.

(56) References Cited

U.S. PATENT DOCUMENTS

| 7,358,752 B1* | 4/2008 | Ramroopsingh .. G01R 31/2818 324/755.02 |
| 7,435,132 B1* | 10/2008 | Fong ..................... H01R 9/038 439/497 |
| 7,497,724 B1* | 3/2009 | Fong ..................... H01R 4/023 439/497 |
| 9,373,915 B1* | 6/2016 | Schulz ............... H01R 13/6594 |
| 9,583,845 B1* | 2/2017 | Heistand, II ........... H01R 12/87 |
| 2002/0168898 A1* | 11/2002 | Billman ............... H01R 13/514 439/607.07 |
| 2004/0014360 A1* | 1/2004 | Crane, Jr. ............ H01R 13/514 439/607.01 |
| 2004/0067680 A1* | 4/2004 | Wu .................... H01R 13/6471 439/497 |

(Continued)

*Primary Examiner* — Timothy J Thompson
*Assistant Examiner* — Rhadames Alonzo Miller
(74) *Attorney, Agent, or Firm* — Isidore PLLC

(57) ABSTRACT

A cable assembly includes a printed circuit board having a first surface and a second surface. A first post and a second post extend from one side of the printed circuit board. A first signal pad, a second signal pad, and a first ground pad are each coupled to the first surface. A first cable has a first signal wire at least partially covered by a first insulator and a second signal wire at least partially covered by a second insulator. The first cable further has a first ground shield at least partially covering the first and second insulators. A first end of a first cable is mounted between the first and second posts. A conductive attachment couples the first ground shield to the first ground pad.

18 Claims, 8 Drawing Sheets

(56) References Cited

U.S. PATENT DOCUMENTS

| | | | |
|---|---|---|---|
| 2005/0156690 A1* | 7/2005 | Brunker | H01P 3/023 333/238 |
| 2006/0042829 A1* | 3/2006 | Matsuo | H01P 3/088 174/255 |
| 2006/0044774 A1* | 3/2006 | Vasavda | G02B 6/4292 361/796 |
| 2008/0174328 A1* | 7/2008 | Miller | G01R 1/07342 324/755.03 |
| 2009/0017693 A1* | 1/2009 | Nagata | H01R 12/724 439/660 |
| 2011/0100694 A1* | 5/2011 | Regnier | H01R 13/6658 174/260 |
| 2013/0017716 A1* | 1/2013 | Elkhatib | H01R 12/594 439/502 |
| 2013/0188325 A1* | 7/2013 | Garman | H05K 9/0007 361/753 |
| 2013/0225004 A1* | 8/2013 | Behziz | H01R 12/53 439/656 |
| 2013/0333936 A1* | 12/2013 | Gundel | H01B 7/0838 174/350 |
| 2014/0014409 A1* | 1/2014 | Lin | H02G 15/08 174/75 R |
| 2014/0034363 A1* | 2/2014 | Biddle | H05K 1/0216 174/254 |
| 2014/0162470 A1* | 6/2014 | Fricker | H01R 12/523 439/65 |
| 2014/0273626 A1* | 9/2014 | Sparrowhawk | H01R 13/6471 439/607.01 |
| 2015/0170794 A1 | 6/2015 | Mutnury et al. | |
| 2015/0357082 A1 | 12/2015 | Mutnury et al. | |
| 2016/0093966 A1* | 3/2016 | Behziz | H01R 12/716 439/607.28 |
| 2016/0218455 A1* | 7/2016 | Sayre | H01R 13/6594 |
| 2016/0276759 A1* | 9/2016 | Tran | H01R 9/035 |
| 2016/0365168 A1 | 12/2016 | Gundel et al. | |
| 2017/0076839 A1 | 3/2017 | Gundel | |
| 2017/0179649 A1* | 6/2017 | Wu | H01B 11/06 |
| 2018/0175558 A1* | 6/2018 | Dai | H01R 9/035 |

\* cited by examiner

CABLE ASSEMBLY FOR AN INFORMATION HANDLING SYSTEM

BACKGROUND

1. Technical Field

The present disclosure generally relates to information handling systems and in particular to a cable assembly for an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system can include a number of electrical cables that connect various components of the information handling system. Within an information handling system, one or more servers can be installed and in communication between the servers can be facilitated by electrical cables. Also, within a server, electrical cables can connect various circuit boards. One type of electrical cable is a differential pair cable that uses differential signals on a pair of wires. Differential signaling is a method for electrically transmitting information using two complementary signals. The technique sends the same electrical signal as a differential pair of signals, each with its own conductor and one or more ground wires. When large numbers of cables are required in an information handling system, difficulties can arise with routing and bending of the cables. Further problems can occur with the termination of differential pair cables that cause impedance mismatches and cross-talk noise.

BRIEF SUMMARY

Disclosed are an information handling system (IHS), a cable assembly, and a method of manufacturing for the cable assembly.

According to one embodiment, an IHS includes a printed circuit board having a first surface and a second surface. A first post and a second post extend from one side of the printed circuit board. A first signal pad, a second signal pad, and a first ground pad are each coupled to the first surface. A first cable has a first signal wire at least partially covered by a first insulator and a second signal wire at least partially covered by a second insulator. The first cable further has a first ground shield at least partially covering the first and second insulators. A first end of a first cable is mounted between the first and second posts. A first conductive attachment couples the first signal wire to the first signal pad, a second conductive attachment couples the second signal wire to the second signal pad, and a third conductive attachment couples the first ground shield to the first ground pad.

Also disclosed is a cable assembly that includes a printed circuit board having a first surface and a second surface. A first post and a second post extend from one side of the printed circuit board. A first signal pad, a second signal pad, and a first ground pad are each coupled to the first surface. A first cable has a first signal wire at least partially covered by a first insulator and a second signal wire at least partially covered by a second insulator. The first cable further has a first ground shield at least partially covering the first and second insulators. A first end of a first cable is mounted between the first and second posts. A first conductive attachment couples the first signal wire to the first signal pad, a second conductive attachment couples the second signal wire to the second signal pad, and a third conductive attachment couples the first ground shield to the first ground pad.

According to one embodiment, a method of manufacturing a cable assembly is disclosed. The method comprises providing a printed circuit board having a first surface and a second surface. The printed circuit board has a first post and a second post extending from one side of the printed circuit board. The printed circuit board further has a first signal pad coupled to the first surface, a second signal pad coupled to the first surface, and a first ground pad coupled to the first surface. The method further includes providing a first cable having a first signal wire at least partially covered by a first insulator, a second signal wire at least partially covered by a second insulator, and a first ground shield at least partially covering the first and second insulators. The method includes mounting the first cable between the first and second posts and attaching the first signal wire to the first signal pad. The method also includes attaching the second signal wire to the second signal pad and attaching the first ground shield to the first ground pad.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
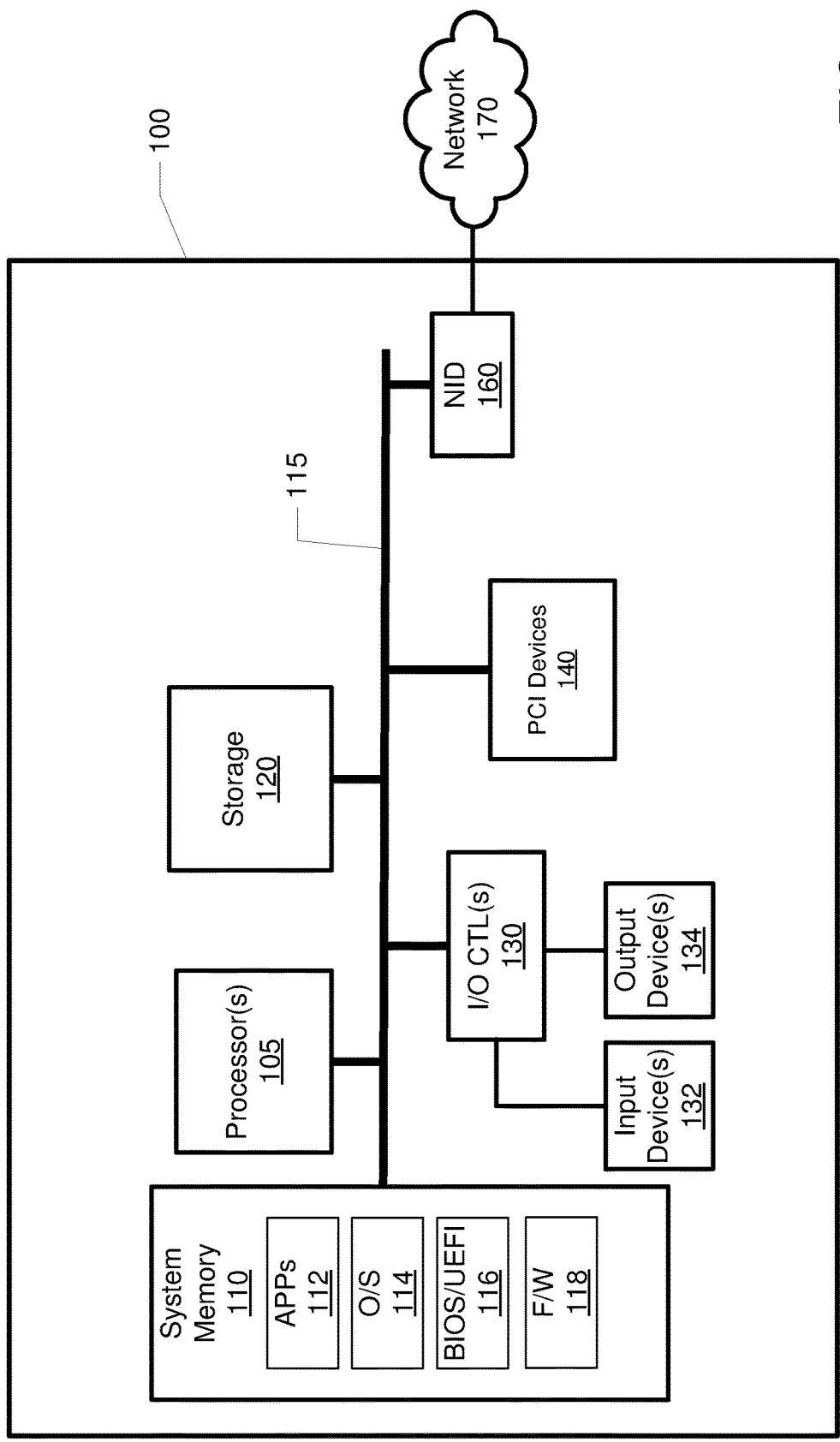
FIG. 1 illustrates an example information handling system within which various aspects of the disclosure can be implemented, according to one or more embodiments.

The illustrative embodiments provide an information handling system (IHS), a cable assembly, and a method of manufacturing the cable assembly. The cable assembly includes a printed circuit board having a first surface and a second surface. A first post and a second post extend from one side of the printed circuit board. A first signal pad, a second signal pad, and a first ground pad are each coupled to the first surface. A first cable has a first signal wire at least partially covered by a first insulator and a second signal wire at least partially covered by a second insulator. The first cable further has a first ground shield at least partially covering the first and second insulators. A first end of a first cable is mounted between the first and second posts. A first conductive attachment couples the first signal wire to the first signal pad, a second conductive attachment couples the second signal wire to the second signal pad, and a third conductive attachment couples the first ground shield to the first ground pad.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes one or more processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can be a hard drive or a solid state drive. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system (BIOS) 116 and firmware (F/W) 118.

In one or more embodiments, BIOS 116 comprises additional functionality associated with unified extensible firmware interface (UEFI), and can be more completely referred to as BIOS/UEFI in these embodiments. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s) or light emitting diodes (LEDs). Additionally, in one or more embodiments, system interconnect 115 is further coupled to peripheral component interconnect (PCI) devices 140. PCI devices 140 can include modems, network cards, sound cards, video cards, shared memory, solid state drives and other hardware devices.

IHS 100 further comprises a network interface device (NID) 160. NID 160 enables IHS 100 to communicate and/or interface with other devices, services, and components that are located external to IHS 100. These devices, services, and components can interface with IHS 100 via an external network, such as example network 170, using one or more communication protocols. Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

Figure 2:
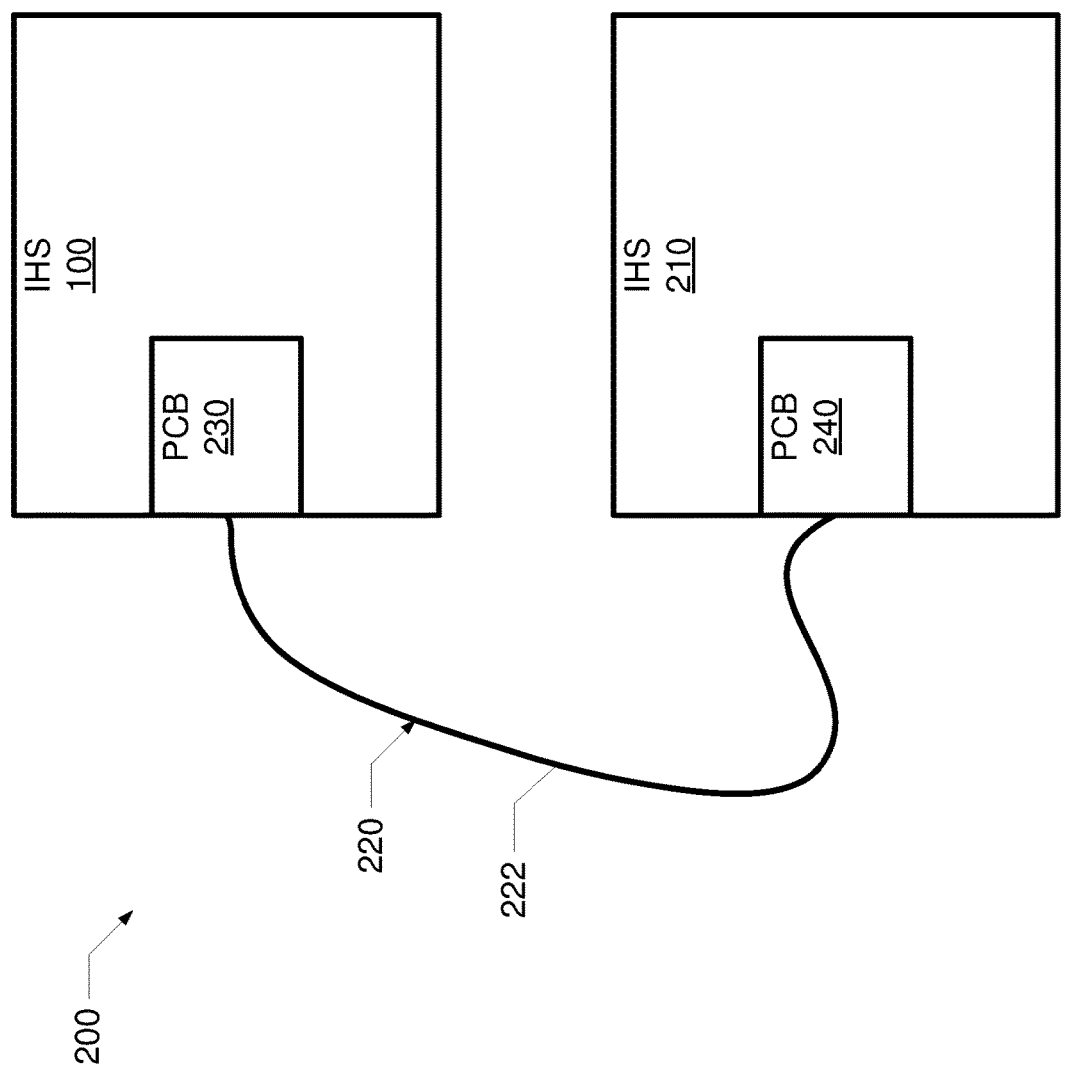
FIG. 2 illustrates information handling systems or servers within a distributed information handling system in communication via a cable assembly, in accordance with one embodiment.

With reference now to FIG. 2, there is shown an exemplary computing system 200 having several IHSs. Computing system 200 can be referred to as a distributed IHS having a plurality of interconnected servers. In the discussion of FIG. 2 and the following figures, the description of each figure can include general reference to the specific components illustrated within the preceding figures. Computing system 200 comprises IHS 100, IHS 210, and electrical cable assembly 220. IHS 100 includes a paddle board or printed circuit board (PCB) 230 and IHS 210 includes paddle board or PCB 240. In one embodiment, PCB 230 and PCB 240 can be motherboards. In another embodiment, PCB 230 and PCB 240 can be a server backplane. Electrical cable assembly 220 includes a dual conductor electrical cable 222 that is communicatively coupled between PCB 230 and PCB 240 via a unique configuration of cable 222 and end connectors (not shown), as provided by the present disclosure. Electrical cable assembly 220 facilitates communications between IHS 100 and IHS 210.

Figure 3:
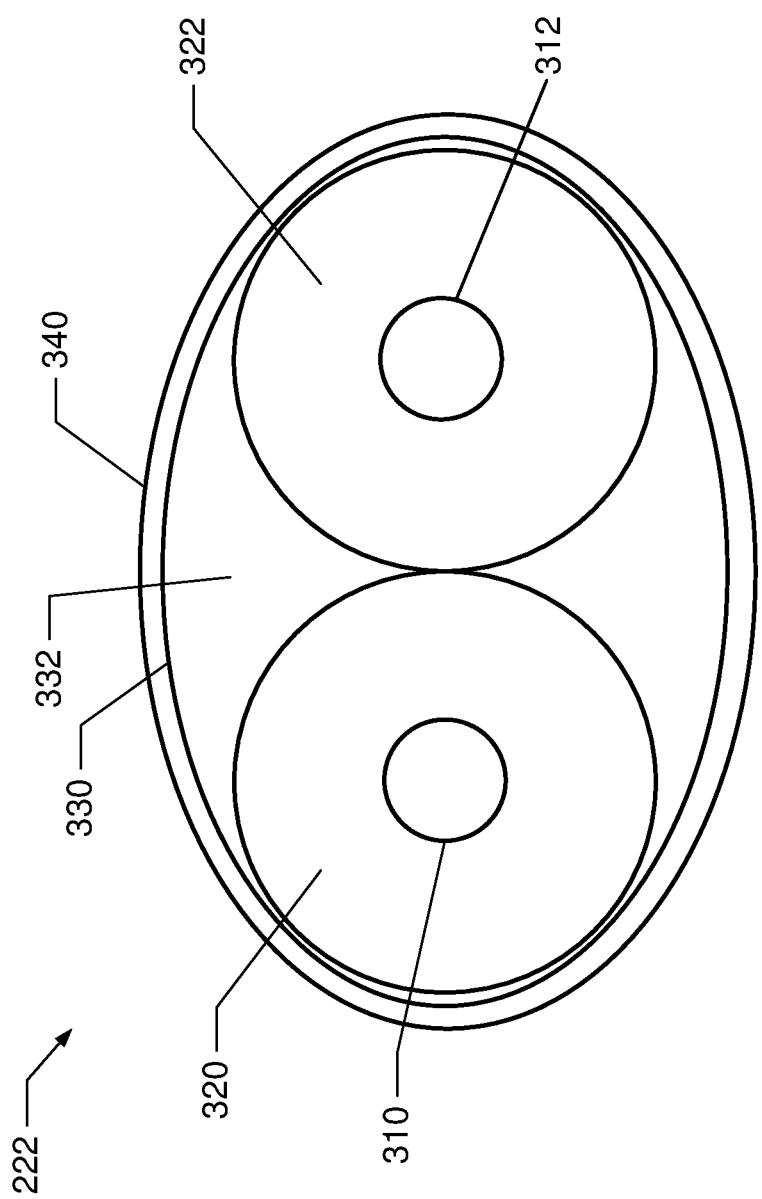
FIG. 3 illustrates a cross-sectional end view of a dual conductor cable, according to one or more embodiments.

Turning to FIG. 3, there is shown an end cross-sectional view of cable 222. In one embodiment, cable 222 can be a differential pair cable. Cable 222 includes a first signal wire 310 and a second signal wire 312. First signal wire 310 is a conductor and is covered by an inner insulator 320. Second signal wire 312 is also a conductor and is covered by an inner insulator 322. Insulator 320 and insulator 322 are arranged substantially side by side or adjacent to each other. The combination of first signal wire 310/insulator 320 and second signal wire 312/insulator 322 is covered by a ground shield 330. In one embodiment, ground shield 330 can be formed from a braided metal material. The space between insulators 320, 322 and ground shield 330 defines a cavity 332, which, in one embodiment, is air-filled. Ground shield 330 serves as an electromagnetic interference shield and as a common mode return path. Ground shield 330 is covered by an outer insulator 340.

Figure 4:
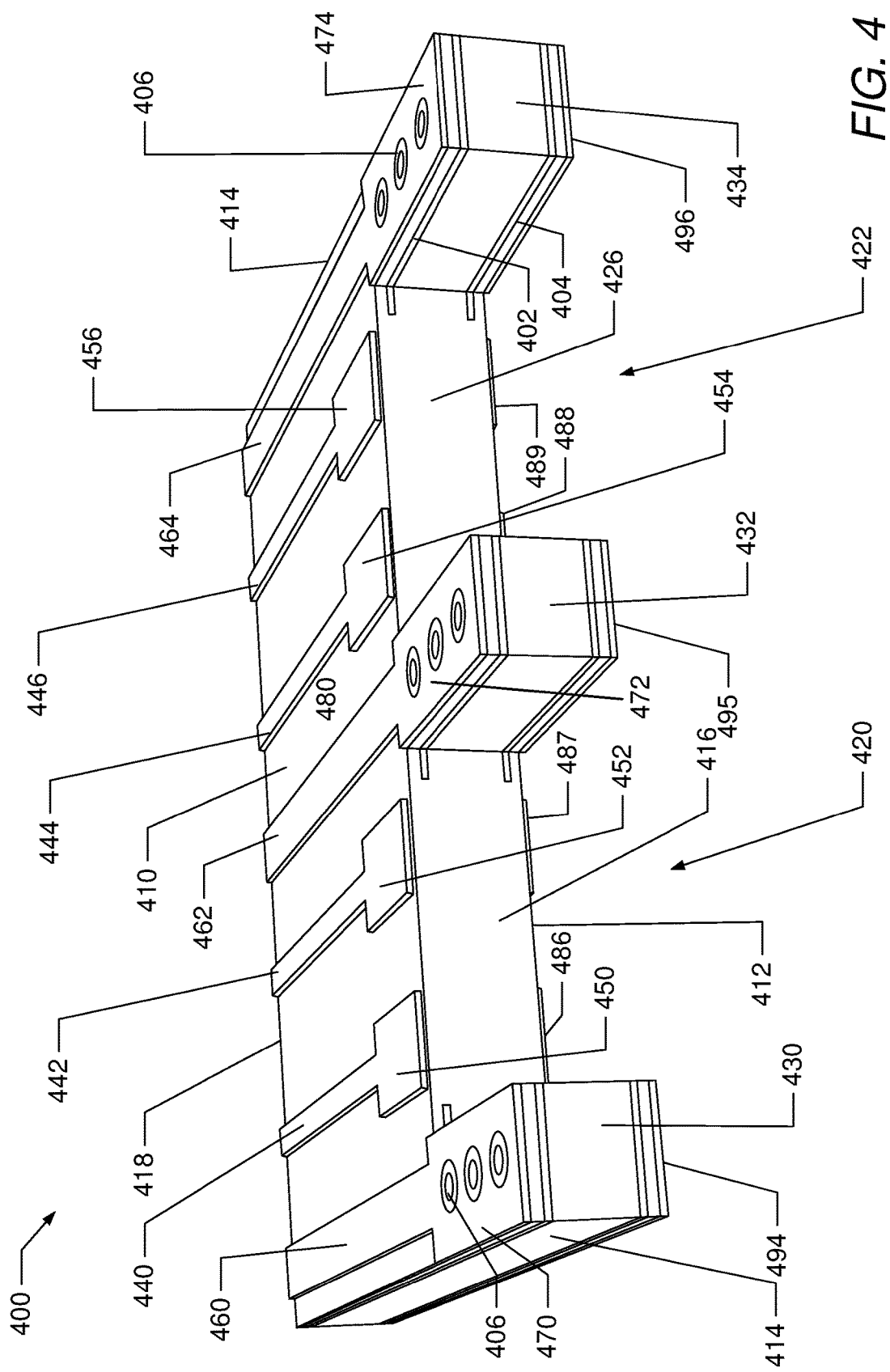
FIG. 4 illustrates a front perspective view of a printed circuit board, according to one or more embodiments.

Referring to FIG. 4, there is shown one embodiment of a PCB 400. PCB 400 can have several internal layers or planes including signal planes and ground planes. PCB 400 is generally planar in shape and includes a top surface 410, a bottom surface 412, opposed lateral sides 414, a front side 416 and a back side 418. Three posts 430, 432 and 434 extend outwardly from front side 416. Posts 430 and 432 define a rectangular shaped cavity or slot 420 and posts 432 and 434 define a rectangular shaped cavity or slot 422. Slots 420 and 422 are dimensioned to receive an end of cable 222 (FIG. 3). Signal lines 440, 442, 444 and 446, are located on the top surface 410. Each signal line terminates in a respective signal pad 450, 452, 454 and 456 located at the back of slots 420, 422 toward upper front side 416. Ground lines 460, 462 and 464 are located on top surface 410. Each ground line terminates in a respective ground pad 470, 472 and 474 located on one of the posts.

Similarly, signal lines 480, 481, 482 and 484 (FIG. 5) are located on the bottom surface 412. Each signal line terminates in a respective signal pad 486, 487, 488 and 489 located at the back of slots 420, 422 toward lower front side 416. Ground lines 490, 491 and 493 (FIG. 5) are located on bottom surface 412. Each ground line terminates in a respective ground pad 494, 495 and 496 located on one of the posts. PCB 400 further includes an upper ground plane 402 and a lower ground plane 404 that can be coupled to an electrical ground of IHS 100. Several ground vias 406 extend through each of the posts 430, 432 and 434 between the ground pads and are connected to the upper ground plane 402 and the lower ground plane 404. Ground vias 406 electrically connect ground pads 470, 472 474, 494, 495 and 496 and ground planes 402 and 404 to ground.

Figure 5:
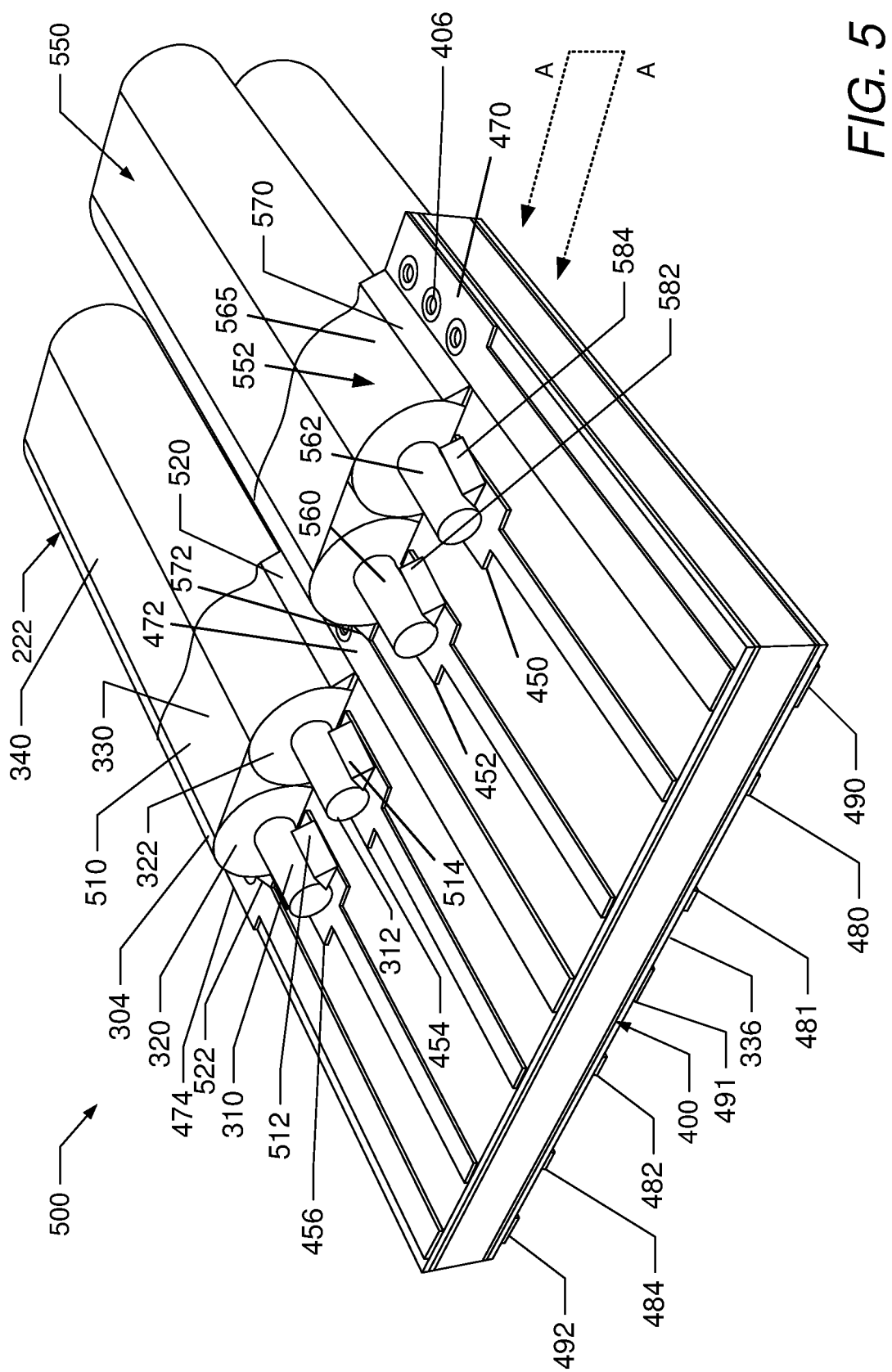
FIG. 5 illustrates a rear perspective view of a cable assembly, according to one or more embodiments.

FIG. 5 illustrates a rear perspective view of a cable assembly 500. Cable assembly 500 includes cables 222 and 550. Cable 222 has a cable end 510 that is mounted into slot 422 (FIG. 4) between posts 432 and 434 (FIG. 4) with first signal wire 310 resting on signal pad 456, second signal wire 312 resting on signal pad 454, and ground shield 330 adjacent to ground pads 472 and 474. First signal wire 310 is attached to signal pad 456 by a conductive attachment material such as solder 512 and second signal wire 312 is attached to signal pad 454 by conductive attachment material such as solder 514. Ground shield 330 is attached to ground pad 472 by conductive attachment material such as solder 520 and ground shield 330 is also attached to ground pad 474 by solder 522.

Similarly, cable 550 has a cable end 552 mounted into the slot 420 (FIG. 4) between posts 432 and 434 (FIG. 4) with first signal wire 560 resting on signal pad 452, second signal wire 562 resting on signal pad 452, and ground shield 565 adjacent to ground pads 470 and 472. First signal wire 560 is attached to signal pad 452 by a conductive material such as solder 582 and second signal wire 562 is attached to signal pad 450 by solder 584. Ground shield 565 is attached to ground pad 470 by solder 570, and ground shield 565 is attached to ground pad 472 by solder 572.

Figure 6:
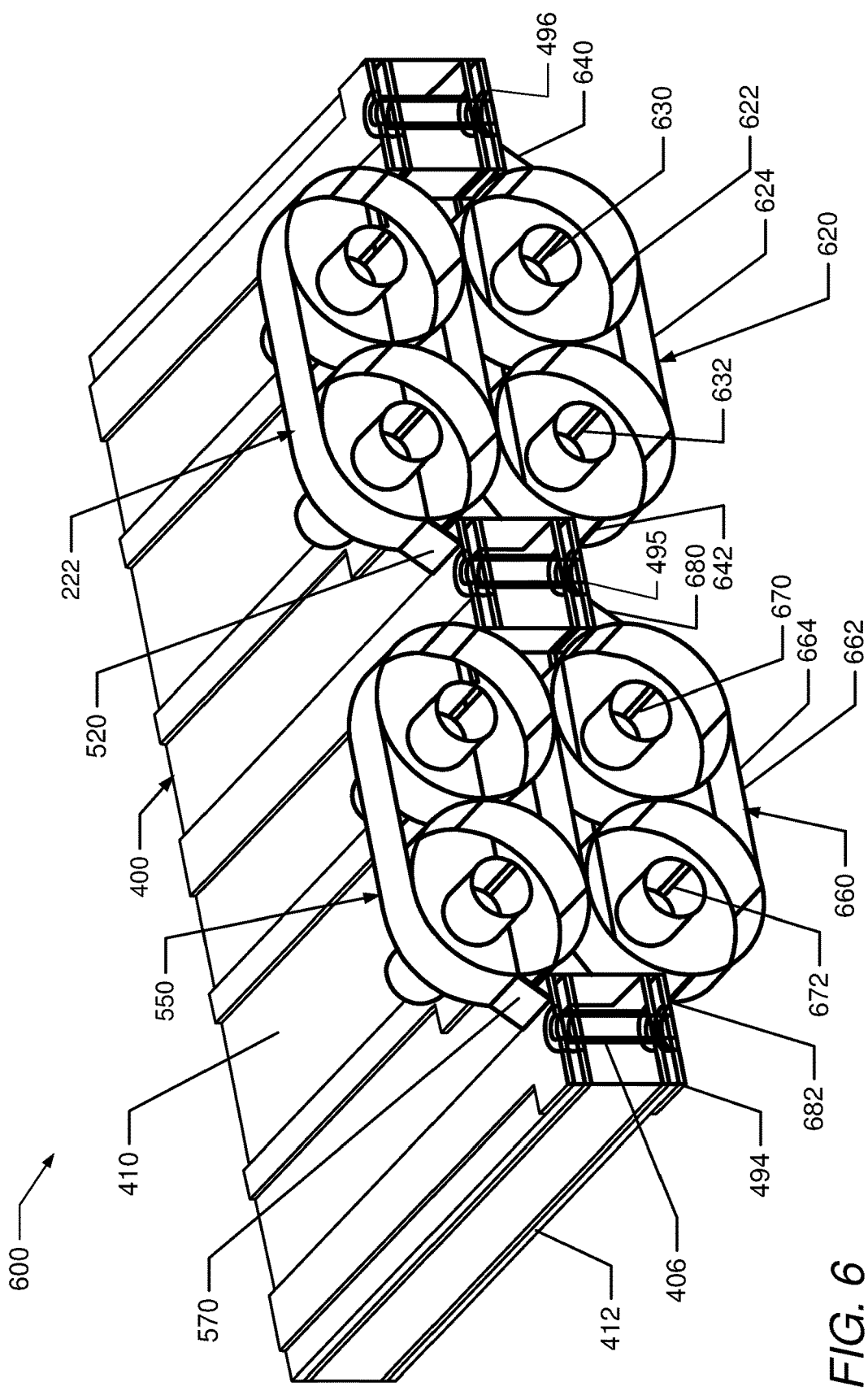
FIG. 6 illustrates a rear perspective view of the cable assembly of FIG. 5 with a cross-section taken thru the cable and printed circuit board along section line A-A, according to one or more embodiments.

FIG. 6 illustrates a rear perspective view of a cable assembly 600. Cable assembly 600 is similar to cable assembly 500 of FIG. 5 except that cables 620 and 660 have been added and mounted to bottom surface 412. Cable 620 has a cable end 622 that is mounted into slot 422 (FIG. 4) between posts 432 and 434 (FIG. 4) and below cable 222. Cable 620 has first signal wire 630 resting on signal pad 489 (FIG. 4), second signal wire 632 resting on signal pad 488

(FIG. 4), and a ground shield 624 adjacent to ground pads 496 and 495 (FIG. 4). First signal wire 630 is attached to signal pad 489 by solder (not shown), and second signal wire 632 is attached to signal pad 488 by solder (not shown). Ground shield 624 is attached to ground pad 496 by solder 640, and ground shield 624 is attached to ground pad 495 by solder 642.

Cable 660 has a cable end 662 that is mounted into slot 420 between posts 430 and 432 and below cable 550. Cable 660 has first signal wire 670 resting on signal pad 487 (FIG. 4), second signal wire 672 resting on signal pad 486 (FIG. 4), and a ground shield 664 adjacent to ground pads 495 and 494 (FIG. 4). First signal wire 670 is attached to signal pad 487 (FIG. 4) by solder (not shown), and second signal wire 672 is attached to signal pad 486 by solder (not shown). Ground shield 664 is attached to ground pad 495 by solder 680, and ground shield 664 is attached to ground pad 494 by solder 682.

Cable assembly 600 has several advantages. While cable assembly 600 is shown having four cables, more or fewer cables can be used with cable assembly 600. The use of cable assembly 600 can eliminate a drain wire in a differential pair cable without compromising signal integrity performance. With the drain wire removed, the cable is more flexible and easier to bend. The removal of the drain wire results in a cable that costs less to manufacture. The use of solder connections on each side of the ground shield provides a common-mode return path with improved electrical performance. Attaching the ground shield to the ground pads on each side of the cable improves impedance matching. The mechanical strength at the termination is improved since soldering the ground shield on each side of the cable provides strain relief for the signal wires. Other conductive attachment materials besides solder can also be used such as conductive adhesives.

Figure 7A:
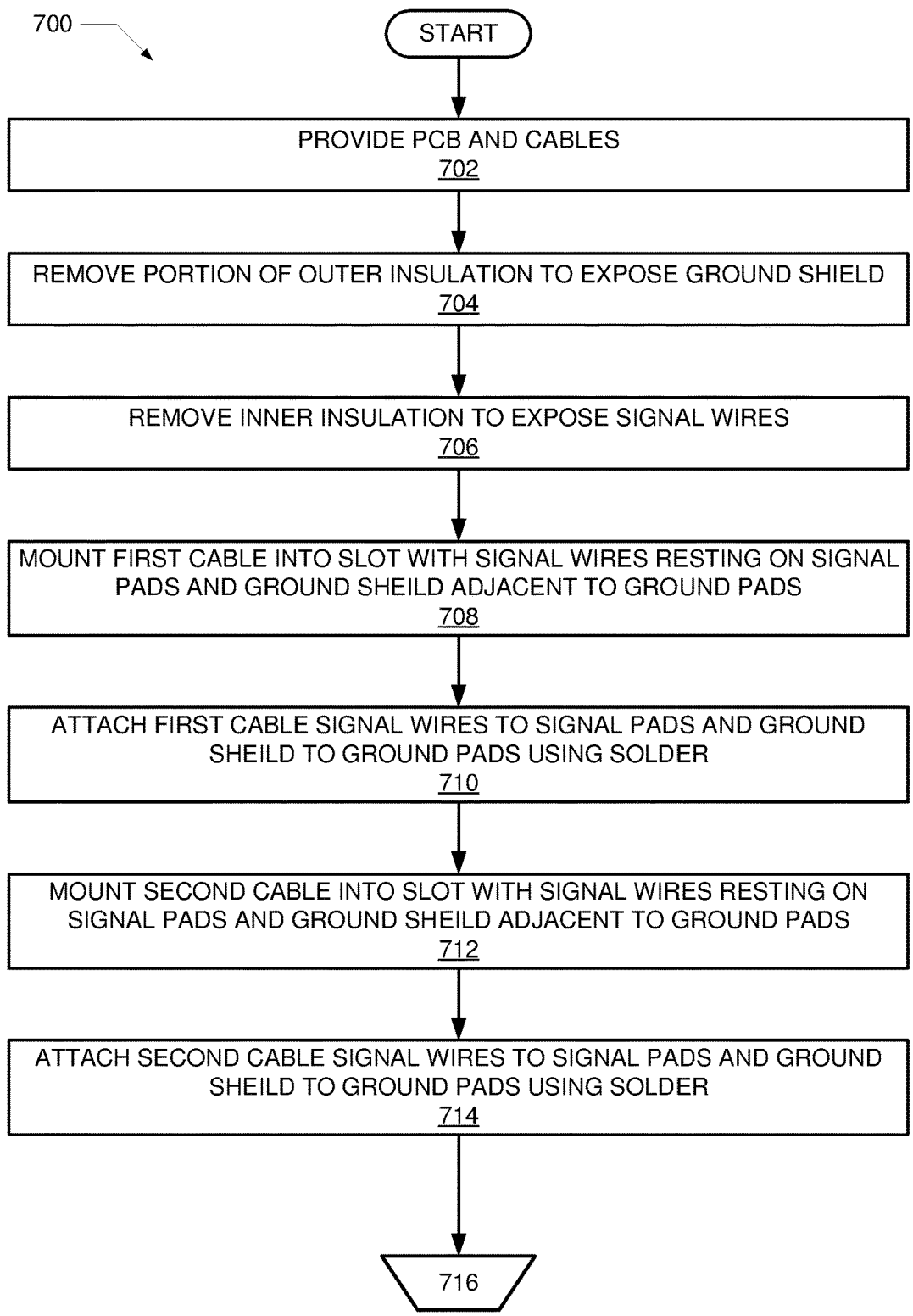
FIGS. 7A and 7B are a flow chart illustrating an example of a method of manufacturing a cable assembly, according to one or more embodiments.
Figure 7B:
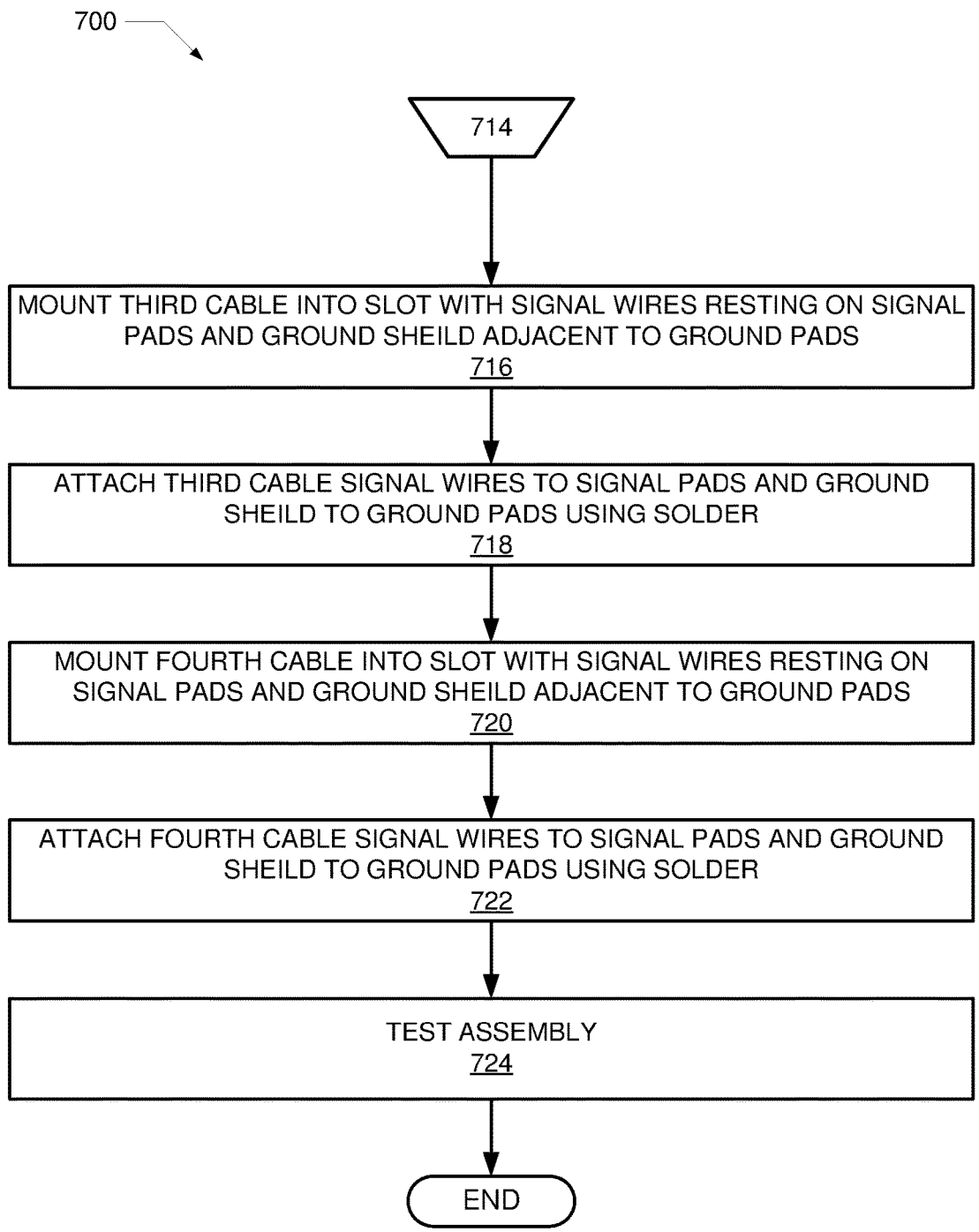

FIGS. 7A and 7B illustrate a flowchart of an exemplary method 700 for manufacturing cable assembly 600 of the preceding figures. The description of the method is provided with general reference to the specific components illustrated within the preceding FIGS. 1-6. With specific reference to FIG. 7A, method 700 begins at the start block and proceeds to block 702 where PCB 400 and cables 222, 550, 620 and 660 are provided. A portion of the outer insulation covering each cable is removed, exposing a portion of the ground shield. A portion of the outer insulation 340 covering cable 222 is removed toward cable end 510 exposing a portion of the ground shield 330 (block 704). The portions of the outer insulation covering each of the other cables (i.e. cables 550, 620 and 660) is also removed in block 704. A portion of inner insulations 320 and 322 covering respective signal wires 310 and 312 are removed toward cable end 510 exposing a portion of signal wires 310 and 312 (block 706). The portion of the inner insulations covering the signal wires in each of the other cables is also removed in block 704.

Cable end 510 of a first cable 222 is mounted into the slot 422 between posts 432 and 434 with the signal wire 310 resting on signal pad 456, signal wire 312 resting on signal pad 454 and ground shield 330 adjacent to ground pads 472 and 474 (block 708). Signal wire 310 is attached to signal pad 456 by heating solder material 512, signal wire 312 is attached to signal pad 454 by heating solder material 514, ground shield 330 is attached to ground pad 472 by heating solder material 520, and ground shield 330 is attached to ground pad 474 by heating solder 522 (block 710).

At block 712, cable end 552 of a second cable 550 is mounted into the slot 420 between posts 430 and 432 with the signal wire 560 resting on signal pad 452, signal wire 562 resting on signal pad 450, and ground shield 565 adjacent to ground pads 470 and 472. The signal wire 560 is attached to signal pad 452 by heating solder 582, signal wire 562 is attached to signal pad 450 by heating solder 584, ground shield 565 is attached to ground pad 470 by heating solder material 570, and ground shield 565 is attached to ground pad 472 by heating solder 572 (block 714).

With reference now to FIG. 7B, At block 716, cable end 622 of a third cable 620 is mounted into slot 422 between posts 432 and 434 with the signal wire 630 resting on signal pad 489, signal wire 632 resting on signal pad 488, and ground shield 624 adjacent to ground pads 496 and 495. Signal wire 630 is attached to signal pad 489 by heating solder material (not shown), signal wire 632 is attached to signal pad 488 by heating solder material (not shown), ground shield 624 is attached to ground pad 496 by heating solder material 640, and ground shield 624 is attached to ground pad 496 by heating solder material 642 (block 718).

At block 720, cable end 662 of a fourth cable 660 is mounted into the slot 420 between posts 430 and 432 with the signal wire 670 resting on signal pad 487, signal wire 672 resting on signal pad 486, and ground shield 664 adjacent to ground pads 495 and 494. Signal wire 670 is attached to signal pad 487 by heating solder material (not shown), signal wire 672 is attached to signal pad 486 by heating solder material (not shown), ground shield 664 is attached to ground pad 495 by heating solder material 680, and ground shield 664 is attached to ground pad 494 by heating solder material 682 (block 722). Cable assembly 500 is electrically tested for electrical continuity using a test meter such as a voltage and resistance meter (block 724). Method 700 concludes at the end block.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system having a cable assembly, the information handling system comprising:
    a printed circuit board having a first surface and a second surface opposed to the first surface;
    a first post and a second post extending from one side of the printed circuit board (PCB) to define a slot within the one side of the PCB;
    a first signal line that terminates into a first signal pad, a second signal line that terminates into a second signal pad, and two ground lines, each terminating into a respective one of a first ground pad and a second ground pad that extends onto a respective one of the first post and the second post, each of the first signal line, second signal line, and two ground lines coupled to the first surface;
    a first cable having a first signal wire at least partially covered by a first insulator, a second signal wire at least partially covered by a second insulator, and a first ground shield extending around an exterior of and at least partially covering the first and second insulators, a first end of the first cable mounted in the slot between the first and second posts;
    an outer insulator that partially covers the ground shield; and
    a first conductive attachment coupling the first signal wire to the first signal pad, a second conductive attachment coupling the second signal wire to the second signal pad, and a third conductive attachment coupling the first ground shield to the first ground pad.

2. The information handling system of claim 1, further comprising:
    a fourth conductive attachment coupling the first ground shield to the second ground pad.

3. The information handling system of claim 2, wherein the third conductive attachment and the fourth conductive attachment are located on opposed sides of the cable.

4. The information handling system of claim 1, wherein the first and second posts define a first slot there between, the first end of the first cable mounted in the first slot.

5. The information handling system of claim 4, wherein the first slot is dimensioned to receive the first end of the cable such that the first ground shield is located adjacent to the first ground pad and a second ground pad.

6. The information handling system of claim 1, further comprising:
at least one ground via extending from the first surface of each of the first ground pad and the second ground pad through the respective one of the first post and the second post to the second surface, the at least one ground connected to an upper ground plane and a lower ground plane within the printed circuit board, wherein the ground vias electrically connect the first and second ground pad and upper and lower ground planes to ground.

7. The information handling system of claim 6, further comprising:
a third signal pad, a fourth signal pad, and a third ground pad, each coupled to the second surface;
a second cable having a third signal wire at least partially covered by a third insulator, a fourth signal wire at least partially covered by a fourth insulator and a second ground shield at least partially covering the third and fourth insulators; and
the third signal wire coupled to the third signal pad, the fourth signal wire coupled to the fourth signal pad and the second ground shield coupled to the third ground pad via a third conductive attachment.

8. The information handling system of claim 7, wherein the second cable is mounted opposed to and below the first cable.

9. A cable assembly comprising:
a printed circuit board having a first surface and a second surface opposed to the first surface;
a first post and a second post extending from one side of the printed circuit board (PCB) to define a slot within the one side of the PCB;
a first signal line that terminates into a first signal pad, a second signal line that terminates into a second signal pad, and two ground lines, each terminating into a respective one of a first ground pad and a second ground pad that extends onto a respective one of the first post and the second post, each of the first signal line, second signal line, and two ground lines coupled to the first surface;
a first cable having a first signal wire at least partially covered by a first insulator, a second signal wire at least partially covered by a second insulator, and a first ground shield extending around an exterior of and at least partially covering the first and second insulators, a first end of the first cable mounted in the slot between the first and second posts;
an outer insulator that partially covers the ground shield; and
a first conductive attachment coupling the first signal wire to the first signal pad, a second conductive attachment coupling the second signal wire to the second signal pad, and a third conductive attachment coupling the first ground shield to the first ground pad.

10. The cable assembly of claim 9, further comprising:
a fourth conductive attachment coupling the first ground shield to the ground pad.

11. The cable assembly of claim 10, wherein the first conductive attachment and the second conductive attachment are located on opposed sides of the cable.

12. The cable assembly of claim 9, wherein the first and second posts define a first slot there between, the first end of the first cable mounted in the first slot.

13. The cable assembly of claim 12, wherein the first slot is dimensioned to receive the first end of the cable such that the first ground shield is located adjacent to the first ground pad and a second ground pad.

14. The cable assembly of claim 9, further comprising:
at least one ground via extending from the first surface of each of the first ground pad and the second ground pad through the respective one of the first post and the second post to the second surface, the at least one ground connected to an upper ground plane and a lower ground plane within the printed circuit board, wherein the ground vias electrically connect the first and second ground pad and upper and lower ground planes to ground.

15. The cable assembly of claim 9, further comprising:
a third signal pad coupled to the second surface;
a fourth signal pad coupled to the second surface;
a third ground pad coupled to the second surface;
a second cable having a third signal wire at least partially covered by a third insulator, a fourth signal wire at least partially covered by a fourth insulator and a second ground shield at least partially covering the third and fourth insulators; and
the third signal wire coupled to the third signal pad, the fourth signal wire coupled to the fourth signal pad and the second ground shield coupled to the third ground pad via a third conductive attachment.

16. The cable assembly of claim 15, wherein the second cable is mounted opposed to adjacent to and below the first cable.

17. The cable assembly of claim 9, wherein a space created between the first and second insulators defines a cavity that is air filled.

18. The cable assembly of claim 9, wherein the ground shield serves as an electromagnetic interference shield and as a common mode return path.

* * * * *